US012660414B2

(12) United States Patent

Cheon

(10) Patent No.: US 12,660,414 B2

(45) Date of Patent: Jun. 16, 2026

(54) DISPLAY DEVICE

(71) Applicant: Samsung Display Co., LTD., Yongin-si (KR)

(72) Inventor: Soohong Cheon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 685 days.

(21) Appl. No.: 17/886,315

(22) Filed: Aug. 11, 2022

(65) Prior Publication Data

US 2023/0137278 A1 May 4, 2023

(30) Foreign Application Priority Data

Nov. 1, 2021 (KR) ........................ 10-2021-0148018

(51) Int. Cl.
  *H10K 50/86* (2023.01)
  *H10K 59/38* (2023.01)
(52) U.S. Cl.
  CPC ........... *H10K 50/865* (2023.02); *H10K 59/38* (2023.02)
(58) Field of Classification Search
  CPC .... H10K 50/13; H10K 50/156; H10K 50/166; H10K 50/81; H10K 50/82; H10K 50/824; H10K 50/84; H10K 50/8428; H10K 50/865; H10K 59/1315; H10K 59/38; H10K 59/80522; H10K 59/8723; H10K 71/00
  See application file for complete search history.

(56) References Cited

U.S. PATENT DOCUMENTS

| | | | |
|---|---|---|---|
| 2015/0318447 A1 | 11/2015 | Choi | |
| 2017/0125508 A1* | 5/2017 | Kim | ..................... H10K 50/824 |
| 2018/0095195 A1* | 4/2018 | Kim | ...................... G02B 5/003 |
| 2019/0043927 A1 | 2/2019 | Jang et al. | |
| 2020/0194502 A1 | 6/2020 | Joo et al. | |

FOREIGN PATENT DOCUMENTS

| | | |
|---|---|---|
| KR | 10-0567272 B1 | 4/2006 |
| KR | 10-2015-0129551 A | 11/2015 |
| KR | 10-1711474 B1 | 3/2017 |
| KR | 10-2020-0075950 A | 6/2020 |

* cited by examiner

*Primary Examiner* — Brook Kebede

(74) *Attorney, Agent, or Firm* — Womble Bond Dickinson (US) LLP

(57) ABSTRACT

A display device includes a base substrate and first to third color filter layers. The base substrate includes pixel regions and a light blocking region. A pixel region from among the pixel regions includes first to third light emitting regions emitting light of different colors from each other. The light blocking region surrounds the first to third light emitting regions. The first color filter layer is on the base substrate, has a first color, and overlaps the first light emitting regions and an entirety of the light blocking region. The second color filter layer is on the base substrate, has a second color, and overlaps the second light emitting regions and a portion of the light blocking region. The third color filter layer is on the base substrate, has a third color, and overlaps the third light emitting regions and an entirety of the light blocking region.

19 Claims, 10 Drawing Sheets

FIG. 2

F I G. 3
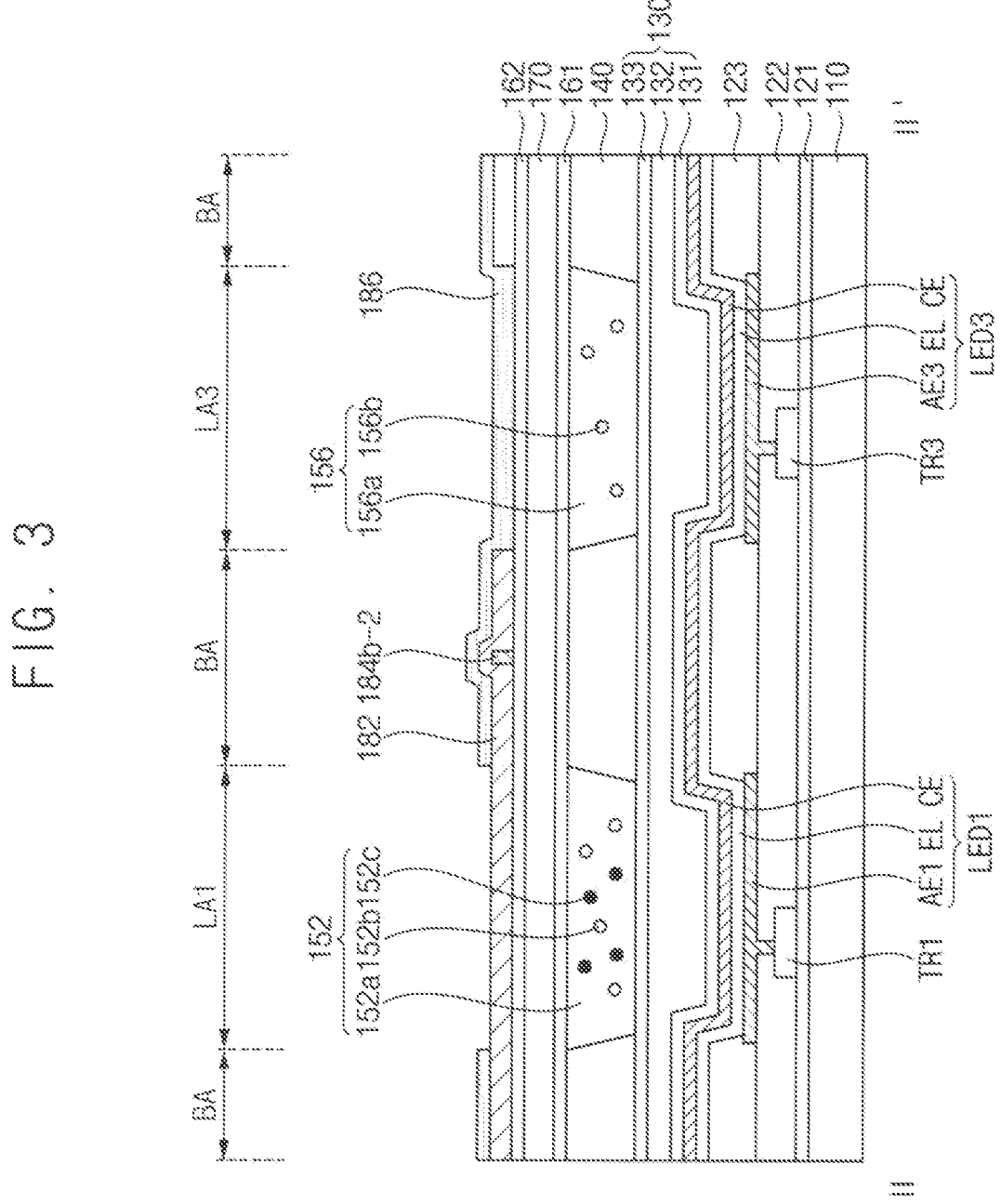

DISPLAY DEVICE

CROSS-REFERENCE TO RELATED APPLICATION

This application claims priority to and the benefit of Korean Patent Application No. 10-2021-0148018, filed on Nov. 1, 2021, in the Korean Intellectual Property Office (KIPO), the entire disclosure of which is incorporated by reference herein.

BACKGROUND

1. Field

Embodiments of the present disclosure relate to a display device. More particularly, embodiments of the present disclosure relate to a large area display device.

2. Description of the Related Art

Flat panel display devices are replacing cathode ray tube display devices as display devices due to their lightweight and thin characteristics. As representative examples of such flat panel display devices, there are liquid crystal display devices and organic light emitting diode display devices.

The display device may include light emitting elements that generate light, color conversion parts that convert a wavelength of the light generated by the light emitting elements, and a color filter layer disposed on the color conversion parts. The color filter layer may include a plurality of color filter layers that selectively transmit light of different colors.

SUMMARY

Aspects of one or more embodiments of the present disclosure are directed toward a display device with improved reliability.

Additional features of the present disclosure will be set forth in the description which follows, and in part will be apparent from the description, or may be learned by practice of the present disclosure.

A display device according to an embodiment may include: a base substrate including a plurality of pixel regions and a light blocking region, a pixel region from among the plurality of pixel regions including first to third light emitting regions emitting light of different colors from each other, the light blocking region surrounding the first to third light emitting regions; a first color filter layer on the base substrate, having a first color, and overlapping the first light emitting regions and an entirety of the light blocking region; a second color filter layer on the base substrate, having a second color, and overlapping the second light emitting regions and a portion of the light blocking region; and a third color filter layer on the base substrate, having a third color, and overlapping the third light emitting regions and an entirety of the light blocking region.

In an embodiment, the first color may be red, the second color may be green, and the third color may be blue.

In an embodiment, an area of the portion of the light blocking region overlapping the second color filter layer may be less than an area of a remaining portion of the light blocking region.

In an embodiment, the second color filter layer may include: island patterns overlapping the second light emitting regions; and connection patterns connecting the island patterns adjacent to each other, the connection patterns overlapping the portion of the light blocking region.

In an embodiment, the connection patterns may be spaced from each of the first light emitting regions and the third light emitting regions.

In an embodiment, the island patterns may be in a matrix form along a first direction and a second direction crossing the first direction. The connection patterns may include: a first connection pattern connecting the island patterns adjacent to each other in the first direction, the first connection pattern extending in the first direction; and a second connection pattern connecting the island patterns adjacent to each other in the second direction, the second connection pattern extending in the second direction.

In an embodiment, a width of the first connection pattern in the second direction may be equal to a width of the second connection pattern in the first direction.

In an embodiment, in the pixel region, the third light emitting region may be spaced from the first light emitting region in the first direction, the second light emitting region may be spaced from the first light emitting region and the third light emitting region in the second direction, and the second connection pattern may be between the first light emitting region and the third light emitting region.

In an embodiment, a width of the second connection pattern in the first direction may be less than a distance between the first light emitting region and the third light emitting region in the first direction.

In an embodiment, the island patterns and the connection patterns may be integrally formed.

In an embodiment, the first color filter layer may define openings exposing the second light emitting regions and the third light emitting regions. The third color filter layer may define openings exposing the first light emitting regions and the second light emitting regions.

In an embodiment, in the light blocking region, the first color filter layer may be on the connection patterns, and the third color filter layer may be on the first color filter layer.

In an embodiment, in the light blocking region, the first color filter layer may cover a side surface of the connection patterns.

In an embodiment, in the light blocking region, the first color filter layer may expose a side surface of the connection patterns.

A display device according to an embodiment may include: a base substrate including a plurality of pixel regions and a light blocking region, a pixel region from among the plurality of pixel regions including first to third light emitting regions emitting light of different colors from each other, the light blocking region surrounding the first to third light emitting regions; a first color filter layer on the base substrate, having a first color, and defining openings exposing the second light emitting regions and the third light emitting regions; a second color filter layer on the base substrate, having a second color, and including island patterns and connection patterns, the island patterns overlapping the second light emitting regions, the connection patterns connecting the island patterns adjacent to each other and overlapping a portion of the light blocking region; and a third color filter layer on the base substrate, having a third color, and defining openings exposing the first light emitting regions and the second light emitting regions.

In an embodiment, the first color may be red, the second color may be green, and the third color may be blue.

In an embodiment, an area of the portion of the light blocking region overlapping the connection patterns may be less than an area of a remaining portion of the light blocking region.

In an embodiment, the connection patterns may be spaced from each of the first light emitting regions and the third light emitting regions.

In an embodiment, the island patterns and the connection patterns may be integrally formed.

In an embodiment, in the light blocking region, the first color filter layer may be on the connection patterns, and the third color filter layer may be on the first color filter layer.

The display device according to embodiments may include the substrate and the first to third color filter layers disposed on the substrate and respectively overlapping the first to third light emitting regions emitting light of different colors. The second color filter layer may include the island patterns respectively overlapping the second light emitting regions and the connection patterns connecting the island patterns adjacent to each other and having a relatively narrow width. Accordingly, a portion of the light blocking region where the second color filter layer overlaps may be minimized or reduced while preventing or reducing the separation of the second color filter layer from a lower layer by the connection patterns. Accordingly, separation of an upper layer disposed on the second color filter layer from the second color filter layer may be prevented or reduced, and penetration of impurities such as moisture into the display region through the second color filter layer may be prevented or reduced. Accordingly, a reliability of the display device may be improved.

It is to be understood that both the foregoing general description and the following detailed description are examples and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure, and together with the description serve to explain the present disclosure.

FIG. 2 is a cross-sectional view taken along the line I-I' of FIG. 1.

FIG. 3 is a cross-sectional view taken along the line II-II' of FIG. 1.

DETAILED DESCRIPTION

Figure 1:
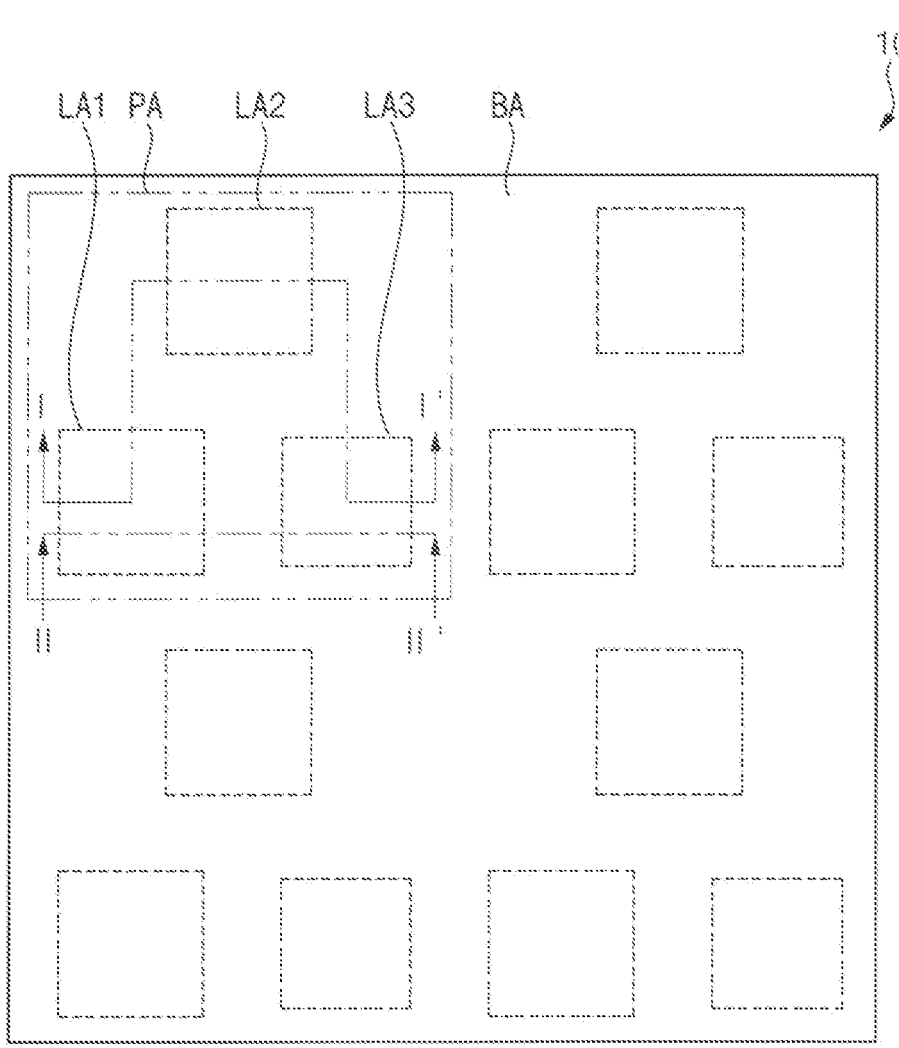
FIG. 1 is an enlarged plan view of a display region of a display device according to an embodiment.
Figure 1:
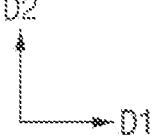

The present disclosure will now be described more fully with reference to the accompanying drawings in which embodiments of the disclosure are shown. Like reference numerals in the drawings denote like elements throughout, and duplicative descriptions thereof may not be provided.

The terminology used herein is for the purpose of describing particular embodiments only and is not intended to limit the embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure."

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

A display device 10 according to an embodiment may include a display region on which an image is displayed and a non-display region positioned around the display region. The non-display region may be positioned outside the display region. For example, the non-display region may be around (or may surround) the display region in a plan view.

FIG. 1 is an enlarged plan view of a display region of a display device according to an embodiment.

Referring to FIG. 1, the display region may include first to third light emitting regions LA1, LA2, and LA3 emitting light of different colors from each other and a light blocking region BA. The first light emitting region LA1 may emit light having a first color, the second light emitting region LA2 may emit light having a second color different from the first color, and the third light emitting region LA3 may emit light having a third color different from the first color and the second color. For example, the first color may be red, the second color may be green, and the third color may be blue, but the present disclosure is not limited thereto. The image may be generated by combining lights respectively emitted from the first to third light emitting regions LA1, LA2, and LA3.

The first to third light emitting regions LA1, LA2, and LA3 adjacent to each other may form one pixel region PA. The display region may include the plurality of pixel regions PA. For example, the pixel regions PA may be disposed in a matrix form along a first direction D1 and a second direction D2 crossing the first direction D1. In this case, in the display region, the plurality of first light emitting regions LA1 may be disposed in a matrix form in the first direction D1 and the second direction D2. Similarly, in the display region, the plurality of second light emitting regions LA2 may be disposed in a matrix form in the first direction D1 and the second direction D2, and the plurality of third light emitting regions LA3 may be disposed in a matrix form in the first direction D1 and the second direction D2. For example, the second direction D2 may be perpendicular to the first direction D1.

In an embodiment, as illustrated in FIG. 1, in each of the pixel regions PA, the third light emitting region LA3 may be spaced from the first light emitting region LA1 in the first direction D1. The second light emitting region LA2 may be spaced from the first light emitting region LA1 and the third light emitting region LA3 in the second direction D2. For example, in each of the pixel regions PA, the first to third light emitting regions LA1, LA2, and LA3 may be disposed to form a triangular shape as a whole in a plan view. However, the present disclosure is not limited thereto. For example, in each of the pixel regions PA, the first to third light emitting regions LA1, LA2, and LA3 may be disposed in various suitable types (e.g., types of arrangements), such as a stripe type, an RGBG type or a PENTILE® (PEN- TILE® is a registered trademark of Samsung Display Co., Ltd., Republic of Korea) type, and/or the like.

The light blocking region BA may be adjacent to the first to third light emitting regions LA1, LA2, and LA3. In an embodiment, as illustrated in FIG. 1, the light blocking region BA may be around (or may surround) each of the first to third light emitting regions LA1, LA2, and LA3 in a plan view. For example, the light blocking region BA may have a grid shape in a plan view. The light blocking region BA may prevent or substantially prevent light emitted from the first to third light emitting regions LA1, LA2, and LA3 from being mixed with each other.

Figure 2:
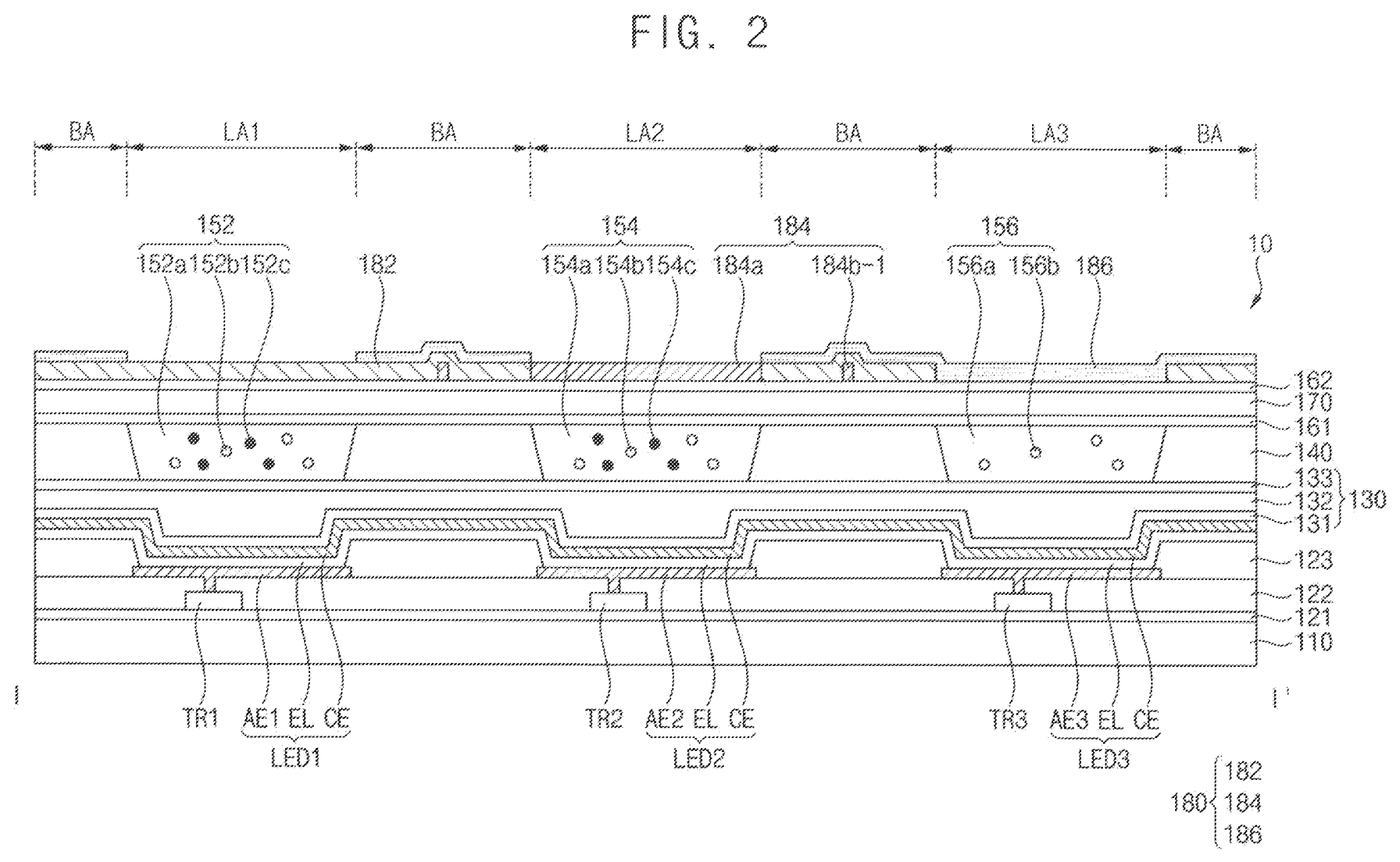

FIG. 2 is a cross-sectional view taken along the line I-I' of FIG. 1. FIG. 3 is a cross-sectional view taken along the line II-II' of FIG. 1.

Referring to FIGS. 1 to 3, in an embodiment, the display device 10 may include a base substrate 110, a buffer layer 121, first to third driving elements TR1, TR2, and TR3, an insulating structure. 122, a pixel defining layer 123, first to third light emitting elements LED1, LED2, and LED3, an encapsulation layer 130, a bank 140, a first color conversion part 152, a second color conversion part 154, a transmission part 156, a first passivation layer 161, a low refractive index layer 170, a second passivation layer 162, and a color filter layer 180.

The base substrate 110 may be an insulating substrate formed of a transparent or opaque material. In an embodiment, the base substrate 110 may include glass. In this case, the display device 10 may be a rigid display device. In another embodiment, the base substrate 110 may include plastic. In this case, the display device 10 may be a flexible display device.

The buffer layer 121 may be disposed on the base substrate 110. The buffer layer 121 may prevent or reduce impurities such as oxygen or moisture from diffusing to an upper portion above (e.g., layers above) the base substrate 110 through the base substrate 110. The buffer layer 121 may include an inorganic insulating material such as a silicon compound, a metal oxide, and/or the like. Examples of the inorganic insulating material may include silicon oxide ($SiO_x$), silicon nitride ($Si_xN_y$), silicon oxynitride ($SiO_xN_y$), silicon oxycarbide ($SiO_xC_y$), silicon carbonitride ($SiC_xN_y$), aluminum oxide ($Al_2O_3$), aluminum nitride ($Al_xN_y$), tantalum oxide ($Ta_xO_y$), hafnium oxide ($HfO_x$), zirconium oxide ($ZrO_x$), titanium oxide ($TiO_x$), and/or the like, but the present disclosure is not limited thereto. These can be used alone or in a combination thereof. The buffer layer 121 may have a single-layer structure or a multi-layer structure including a plurality of insulating layers.

In an embodiment, a lower conductive layer may be disposed between the base substrate 110 and the buffer layer 121. The lower conductive layer may include a conductive material such as a metal, an alloy, a conductive metal nitride, and/or a conductive metal oxide.

For example, the lower conductive layer may be formed of an opaque material. The lower metal layer may block or reduce light incident into channel layers of the first to third driving elements TR1, TR2, and TR3 through the base substrate 110 to prevent or reduce deterioration of electrical properties of the first to third driving elements TR1, TR2, and TR3.

For example, the lower conductive layer may be connected (e.g., electrically connected) to a first electrode or a second electrode of each of the first to third driving elements TR1, TR2, and TR3. For another example, the lower conductive layer may be used as power supply voltage lines, signal lines, and/or the like.

The first to third driving elements TR1, TR2, and TR3 may be disposed in the display region on the buffer layer 121. Each of the first to third driving elements TR1, TR2, and TR3 may include at least one thin film transistor. The channel layer of the thin film transistor may include an oxide semiconductor, a silicon semiconductor, an organic semiconductor, and/or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn), but the present disclosure is not limited thereto. The silicon semiconductor may include an amorphous silicon, a polycrystalline silicon, and/or the like.

The insulating structure 122 may cover the first to third driving elements TR1, TR2, and TR3. The insulating structure 122 may include a combination of at least one inorganic insulating layer and at least one organic insulating layer.

First to third pixel electrodes AE1, AE2, and AE3 may be disposed on the insulating structure 122. Each of the first to third pixel electrodes AE1, AE2, and AE3 may include a conductive material such as a metal, an alloy, a conductive metal nitride, a conductive metal oxide, a transparent conductive material, and/or the like. Each of the first to third pixel electrodes AE1, AE2, and AE3 may have a single-layer structure or a multi-layer structure including a plurality of conductive layers.

The first to third pixel electrodes AE1, AE2, and AE3 may be respectively connected (e.g., electrically connected) to the first to third driving elements TR1, TR2, and TR3 through contact holes formed in the insulating structure 122.

The pixel defining layer 123 may be disposed on the first to third pixel electrodes AE1, AE2, and AE3. The pixel defining layer 123 may include an organic insulating material. Examples of the organic insulating material include a photoresist, a polyacryl-based resin, a polyimide-based resin, a polyamide-based resin, a siloxane-based resin, an acryl-based resin, an epoxy-based resin, and/or the like, but the present disclosure is not limited thereto. These can be used alone or in a combination thereof. The pixel defining layer 123 may define pixel openings respectively exposing at least a portion of each of the first to third pixel electrodes AE1, AE2, and AE3.

An emission layer EL may be disposed on the first to third pixel electrodes AE1, AE2, and AE3 exposed by the pixel openings of the pixel defining layer 123. In an embodiment, the emission layer EL may continuously extend over the plurality of pixels in the display region. In another embodiment, the emission layer EL may be separated from an emission layer of an adjacent pixel.

The emission layer EL may include at least one of an organic light emitting material or quantum dot. In an embodiment, the emission layer EL may generate a blue light. However, the present disclosure is not limited thereto. For example, the emission layer EL may generate a red light, a green light, and/or the like. In another embodiment, the emission layer EL may generate lights having different colors in different pixels.

In an embodiment, the emission layer EL may have a multi-layer structure including a plurality of emission layers. For example, the emission layer EL may have a multi-layer structure in which three blue emission layers each including an organic light emitting material for generating blue light are stacked, but the present disclosure is not limited thereto. For another example, the emission layer EL may have a multi-layer structure in which three blue emission layers each including an organic light emitting material for generating blue light and one green emission layer including an organic light emitting material for generating green light are stacked. In another embodiment, the emission layer EL may have a single-layer structure including one emission layer.

In an embodiment, functional layers such as a hole injection layer, a hole transport layer, an electron transport layer, and an electron injection layer may be disposed on an upper portion and/or a lower portion of the emission layer EL.

A common electrode CE may be disposed on the emission layer EL. The common electrode CE may include a conductive material such as a metal, an alloy, a conductive metal nitride, a conductive metal oxide, a transparent conductive material, and/or the like. The common electrode CE may have a single-layer structure or a multi-layer structure including a plurality of conductive layers. In an embodiment, the common electrode CE may continuously extend over the plurality of pixels in the display region.

The first pixel electrode AE1, the emission layer EL, and the common electrode CE may form the first light emitting element LED1. The second pixel electrode AE2, the emission layer EL, and the common electrode CE may form the second light emitting element LED2. The third pixel electrode AE3, the emission layer EL, and the common electrode CE may form the third light emitting element LED3. In an embodiment, each of the first to third light emitting elements LED1, LED2, and LED3 may generate blue light.

The encapsulation layer 130 may be disposed on the common electrode CE. The encapsulation layer 130 may include at least one inorganic encapsulation layer and at least one organic encapsulation layer. In an embodiment, the encapsulation layer 130 may include a first inorganic encapsulation layer 131 disposed on the common electrode CE, an organic encapsulation layer 132 disposed on the first inorganic encapsulation layer 131, and a second inorganic encapsulation layer 133 disposed on the organic encapsulation layer 132.

The bank 140 may be disposed in the display region on the encapsulation layer 130. A plurality of openings may be formed in the bank 140. For example, as illustrated in FIG. 2, the openings of the bank 140 may respectively expose the first to third light emitting regions LA1, LA2, and LA3. The bank 140 may form a space to receive an ink composition for forming the first color conversion part 152, the second color conversion part 154, and the transmission part 156. For example, the bank 240 may entirely overlap the light blocking region BA, and may have a grid shape in a plan view.

The bank 140 may include an organic material. In an embodiment, the bank 140 may further include a light blocking material. For example, at least a portion of the bank 140 may include a light blocking material such as black pigment, dye, carbon black, and/or the like.

The first color conversion part 152, the second color conversion part 154, and the transmission part 156 may be disposed in the display region on the encapsulation layer 130, and may respectively overlap the first to third light emitting regions LA1, LA2 and LA3. For example, the first color conversion part 152, the second color conversion part 154, and the transmission part 156 may be respectively disposed in the openings of the bank 140.

The first color conversion part 152 may overlap the first light emitting region LA1. The first color conversion part 152 may convert an incident light having a blue color (e.g., light generated by the first light emitting element LED1 and incident into the first color conversion part 152) to a first transmitted light having the first color (e.g., a red color). For example, the first color conversion part 152 may include a resin part 152*a*, scattering particles 152*b*, and wavelength conversion particles 152*c*.

The scattering particles 152*b* may scatter the incident light without substantially changing the wavelength of the incident light. Therefore, a path of a light progressing in (e.g., progressing through) the first color conversion part 152 may be increased. The scattering particles 152*b* may include a metal oxide, an organic material, and/or the like. In an embodiment, the scattering particles 152*b* may not be provided.

In an embodiment, each of the wavelength conversion particles 152*c* may include a quantum dot. The quantum dot may be defined as a nano-crystalline semiconductor material. The quantum dot may absorb an incident light and emit a light having a wavelength different from a wavelength of the incident light. In one or more embodiments, the quantum dot may have a diameter (e.g., an average particle size) equal to or less than about 100 nm. In an embodiment, the quantum dot may have a diameter of about 1 nm to about 20 nm. In an embodiment, each of the wavelength conversion particles 152*c* may include a quantum dot that is to absorb blue light and emit light having the first color.

The scattering particles 152*b* and the wavelength conversion particle 152*c* may be disposed in the resin part 152*a*. For example, the resin part 152*a* may include an epoxy-based resin, an acryl-based resin, a phenol-based resin, a melamine-based resin, a cardo-based resin, an imide-based resin, and/or the like, but the present disclosure is not limited thereto.

The first color conversion part 152 may convert the incident light having a blue color to emit the first transmitted light having the first color. A remainder of the blue light, which is not converted by the first color conversion part 152, may be blocked by a first color filter layer 182. The first color filter layer 182 may allow light having the first color to be transmitted through the first color filter layer 182. Accordingly, in the first light emitting region LA1, the first transmitted light having the first color may be emitted to an outside.

The second color conversion part 154 may overlap the second light emitting region LA2. The second color conversion part 154 may convert an incident light having a blue color (e.g., light generated by the second light emitting element LED2 and incident into the second color conversion part 154) to a second transmitted light having the second color (e.g., agree color). For example, the second color conversion part 154 may include a resin part 154*a*, scattering particles 154*b*, and wavelength conversion particles 154*c*. The resin part 154*a* and the scattering particles 154*b* of the second color conversion part 154 may be substantially the same as or similar to the resin part 152*a* and the scattering particles 152*b* of the first color conversion part 152.

For example, each of the wavelength conversion particles 154*c* of the second color conversion part 154 may include a quantum dot that is to absorb blue light and emit light having the second color. Accordingly, the second color conversion part 154 may convert the incident light having a blue color to emit the second transmitted light having the second color. A remainder of the blue light, which is not converted by the second color conversion part 154, may be blocked by a second color filter layer 184. The second color filter layer 184 may allow light having the second color to be transmitted through the second color filter layer 184. Accordingly, in the second light emitting region LA2, the second transmitted light having the second color may be emitted to the outside.

The transmission part 156 may overlap the third light emitting region LA3. For example, the transmission part 156 may include a resin part 156*a* and scattering particles 156*b*. The resin part 156*a* and the scattering particles 156*b* of the transmission part 156 may be substantially the same as or similar to the resin part 152*a* and the scattering particles 152*b* of the first color conversion part 152.

The transmission part 156 may not convert an incident light having a blue color (e.g., light generated by the third light emitting element LED3 and incident into the transmission part 156). For example, the transmission part 156 may emit a third transmitted light substantially the same as (e.g., substantially the same wavelength as) the incident light. In one or more embodiments, a third color filter layer 186 may allow light having the third color to be transmitted through the third color filter layer 186. Accordingly, in the third light emitting region LA3, the third transmitted light having the third color (e.g., a blue color) may be emitted to the outside.

As the first to third transmitted lights emitted from the first to third light emitting regions LA1, LA2 and LA3 are combined, the image may be displayed in the display region.

The first passivation layer 161 may be disposed on the bank 140, and may cover upper surfaces of the first color conversion part 152, the second color conversion part 154, and the transmission part 156. The first passivation layer 161 may include an inorganic insulating material.

A refractive index of the low refractive index layer 170 may be less than each of a refractive index of the first color conversion part 152, a refractive index of the second color conversion part 154, and a refractive index of the transmission part 156. The low refractive index layer 170 may improve light extraction efficiency to increase luminance and lifespan of the display device 10.

In an embodiment, the low refractive index layer 170 may be disposed on the first passivation layer 161. For example, the low refractive index layer 170 may be disposed on the first color conversion part 152, the second color conversion part 154, and the transmission part 156. In another embodiment, the low refractive index layer 170 may be disposed under the first color conversion part 152, the second color conversion part 154, and the transmission part 156. In still another embodiment, a plurality of low refractive index layers 170 may be provided, and the low refractive index layers 170 may be respectively disposed on and under the first color conversion part 152, the second color conversion part 154, and the transmission part 156. For example, the first color conversion part 152, the second color conversion part 154, and the transmission part 156 may be between a first one of the plurality of low refractive index layers 170 and a second one of the plurality of low refractive index layers 170.

The second passivation layer 162 may cover an upper surface of the low refractive index layer 170. The second passivation layer 162 may include an inorganic insulating material.

The color filter layer 180 may be disposed on the second passivation layer 162. In an embodiment, the color filter layer 180 may include first to third color filter layers 182, 184, and 186. The first to third color filter layers 182, 184, and 186 may have different colors from each other, and may selectively transmit light of different colors from each other.

Figure 4:
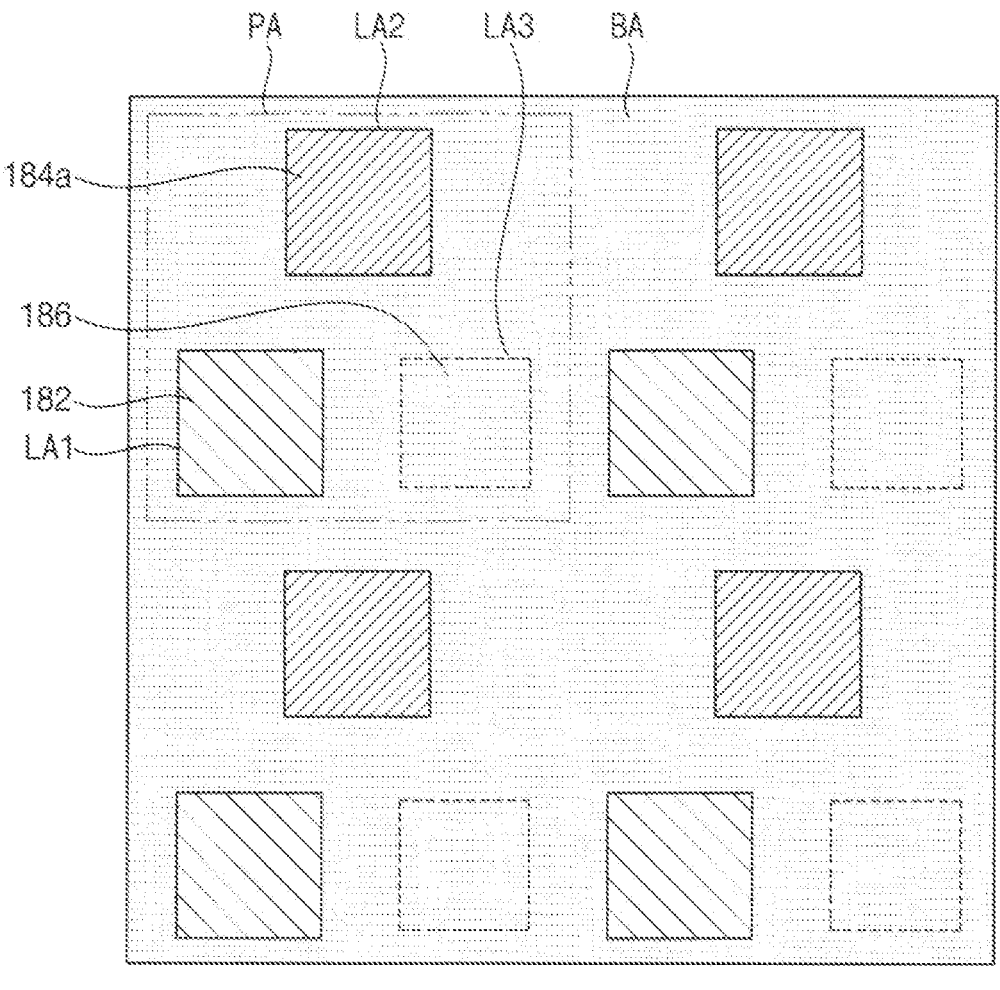
FIG. 4 is a plan view of a color filter layer included in the display device of FIG. 2.
Figure 4:
Figure 5:
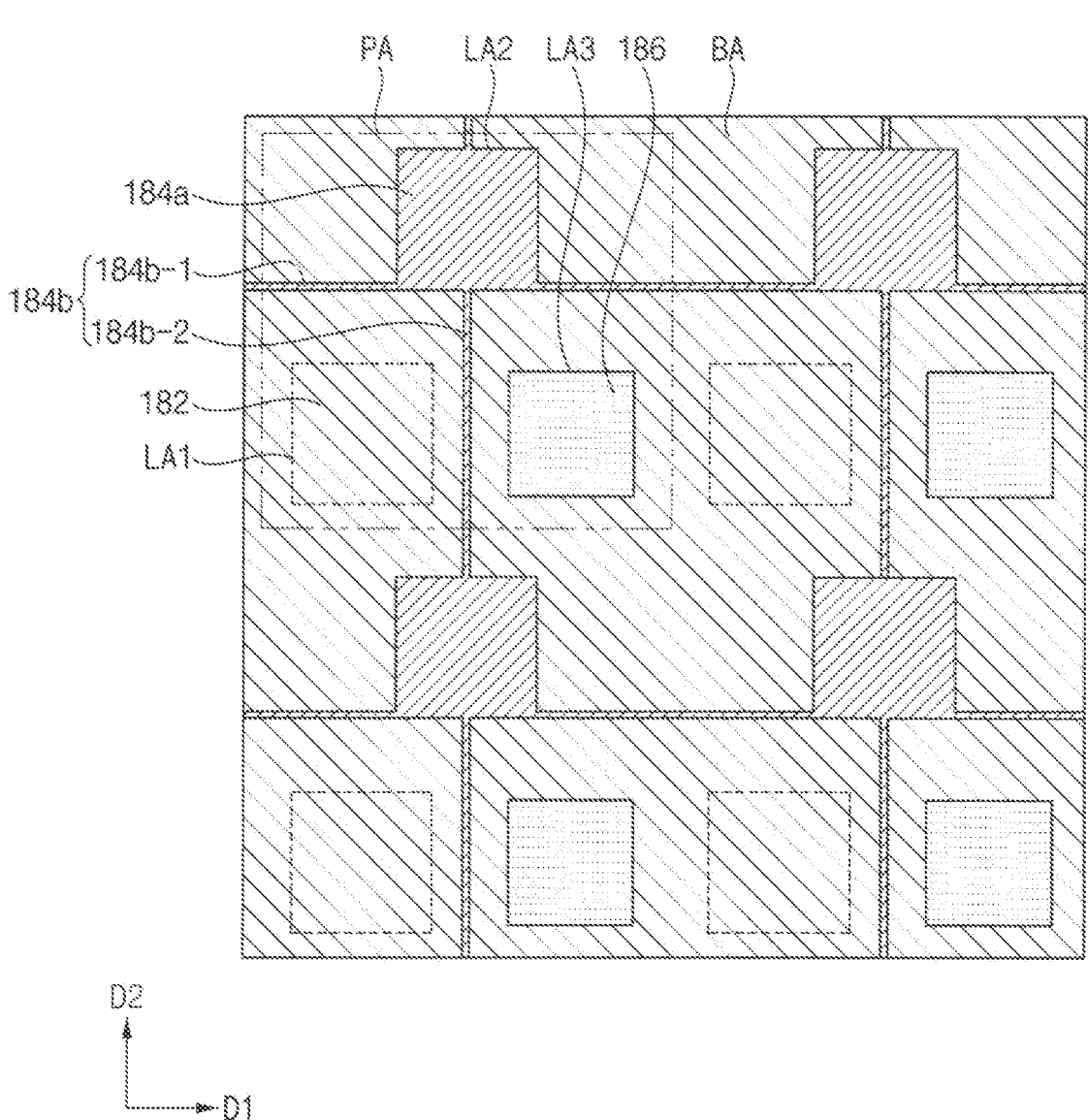
FIG. 5 is a bottom view of the color filter layer of FIG. 4.
Figure 6:
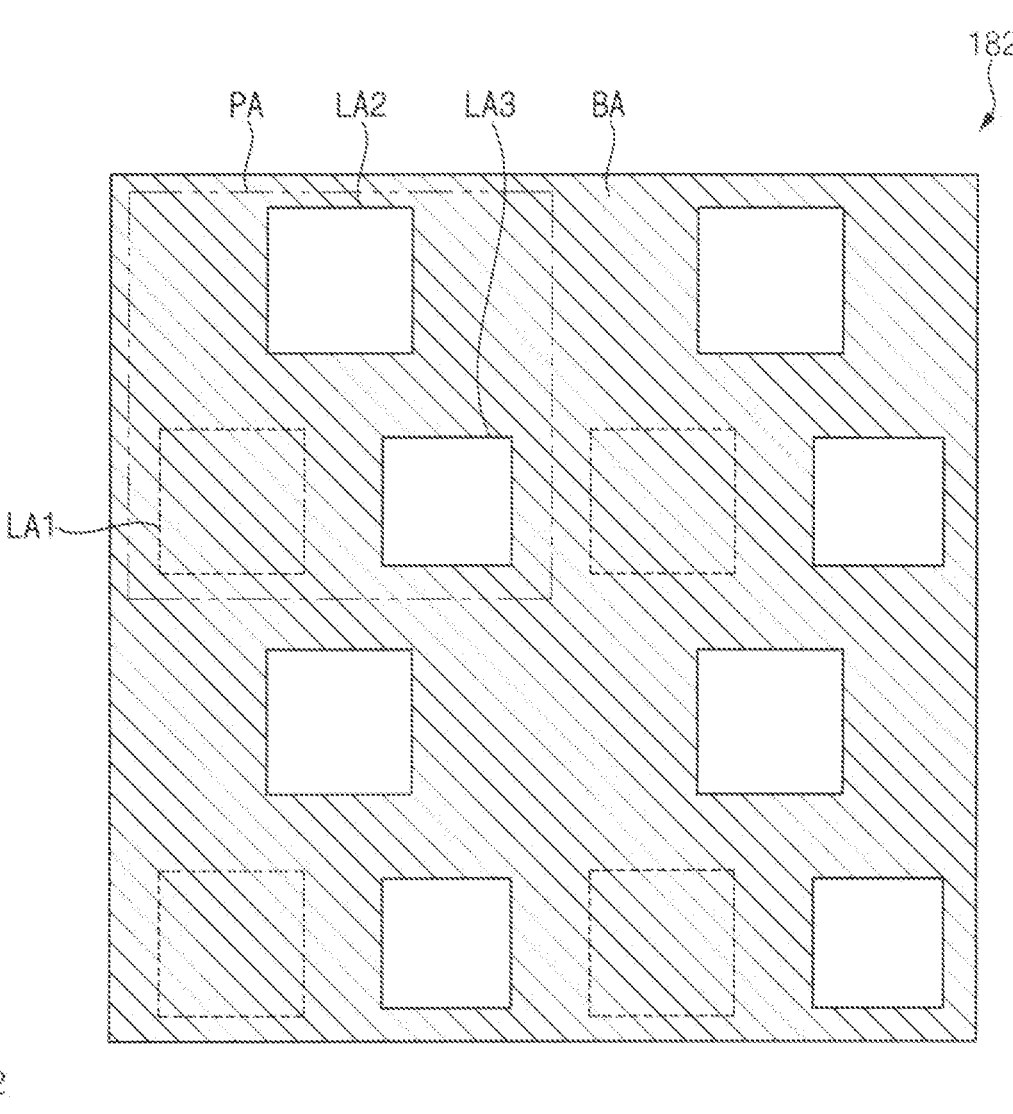
FIG. 6 is a plan view of a first color filter layer included in the color filter layer of FIG. 2.
Figure 6:
Figure 7:
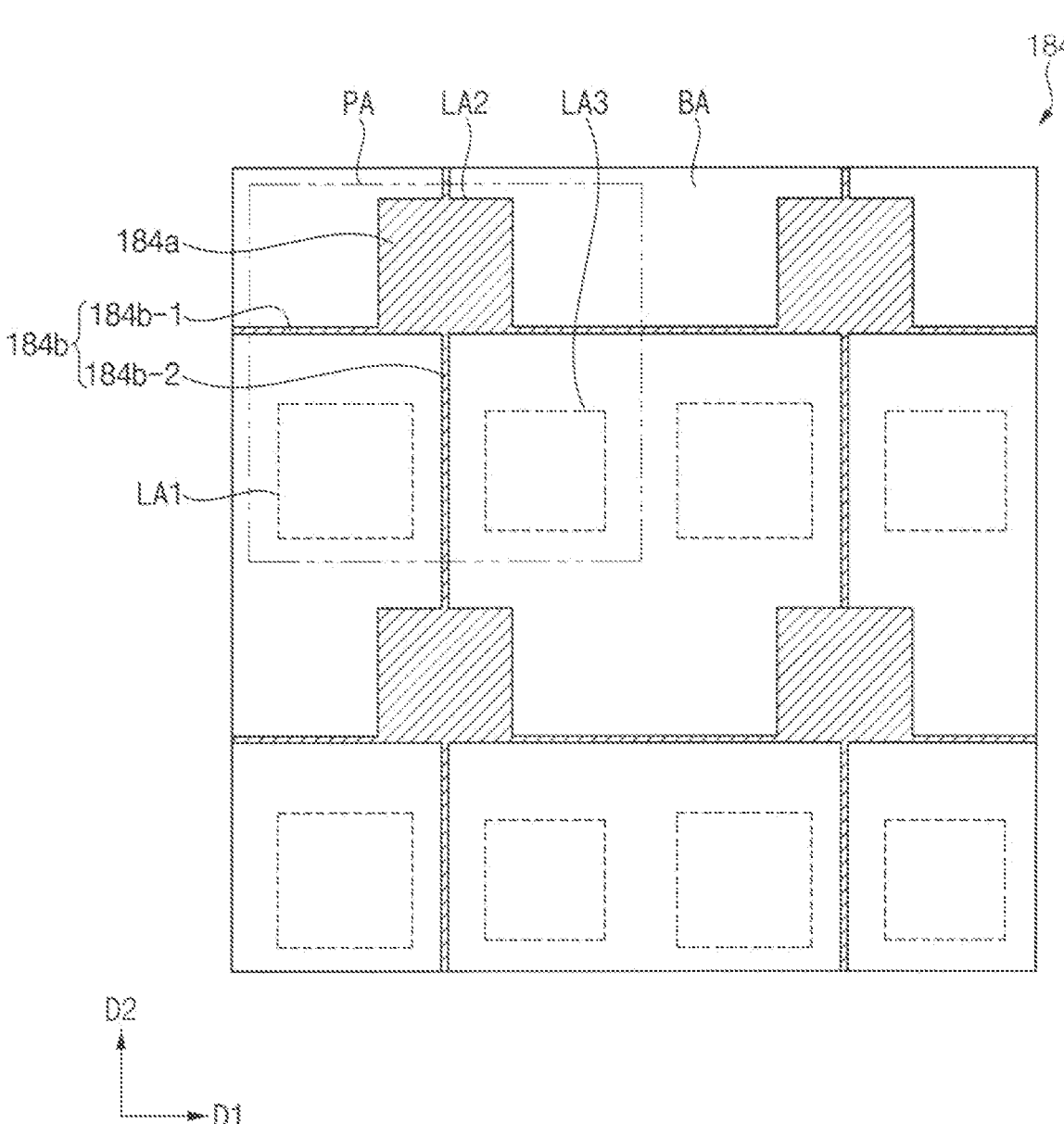
FIG. 7 is a plan view of a second color filter layer included in the color filter layer of FIG. 2.
Figure 8:
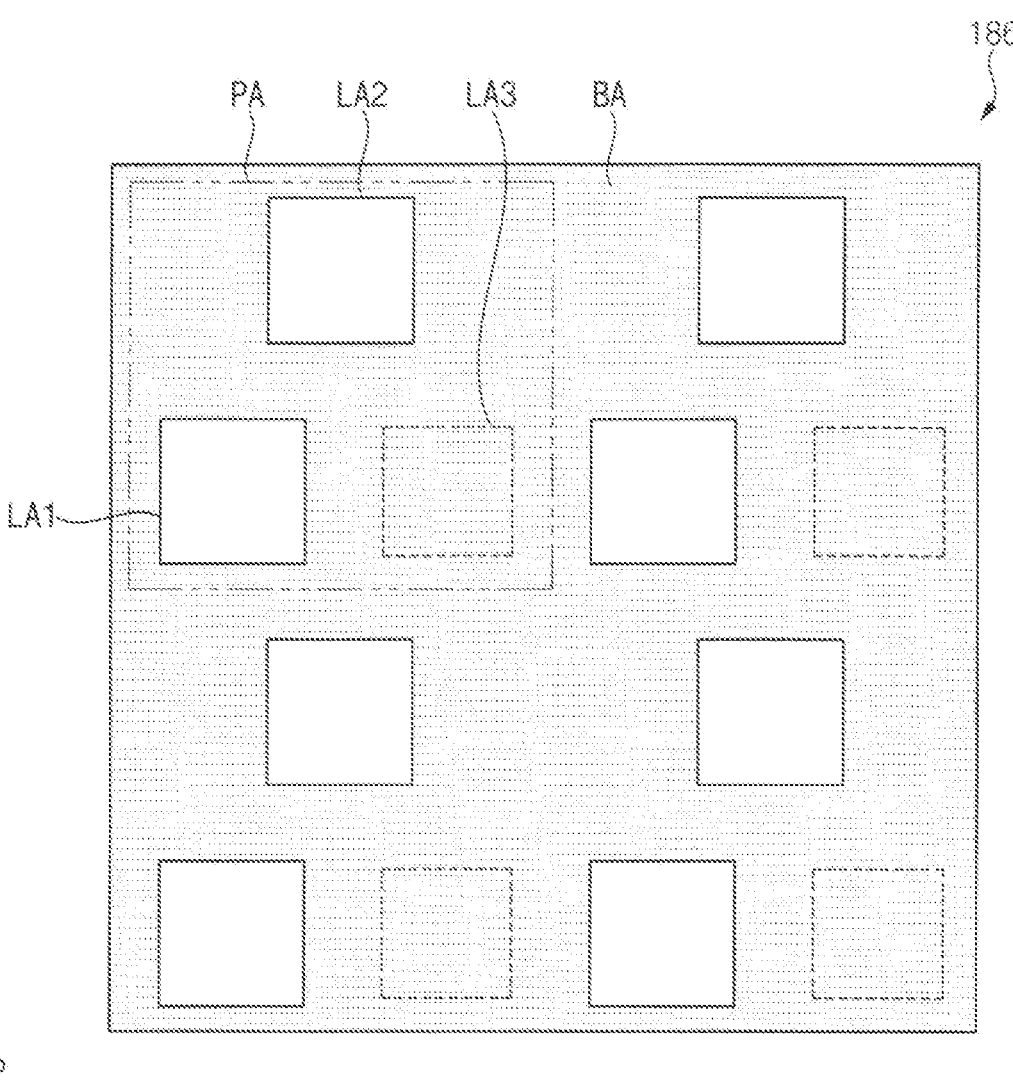
FIG. 8 is a plan view of a third color filter layer included in the color filter layer of FIG. 2.
Figure 8:
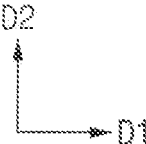

FIG. 4 is a plan view of a color filter layer included in the display device of FIG. 2. FIG. 5 is a bottom view of the color filter layer of FIG. 4. FIG. 6 is a plan view of a first color filter layer included in the color filter layer of FIG. 2. FIG. 7 is a plan view of a second color filter layer included in the color filter layer of FIG. 2. FIG. 8 is a plan view of a third color filter layer included in the color filter layer of FIG. 2. For example, each of FIGS. 4 to 8 may correspond to the plan view of FIG. 1.

Referring to FIGS. 1 to 6, the first color filter layer 182 may have the first color (e.g., a red color), and may selectively transmit light having the first color. For example, the first color filter layer 182 may include an organic material such as a photoresist and dye or pigment having the first color.

As illustrated in FIGS. 4 to 6, the first color filter layer 182 may overlap (e.g., overlap in a thickness direction of the base substrate 110) the first light emitting region LA1. For example, the first color filter layer 182 may overlap each of the plurality of first light emitting regions LA1 disposed in a matrix form in the display region. The first color filter layer 182 may not overlap the second light emitting regions LA2 and the third light emitting regions LA3.

In an embodiment, the first color filter layer 182 may further overlap (e.g., overlap in the thickness direction of the base substrate 110) the light blocking region BA. The first color filter layer 182 may overlap an entirety of the light blocking region BA. For example, as illustrated in FIG. 6, the first color filter layer 182 may entirely overlap the first light emitting regions LA1 and the light blocking region BA in a plan view, and may have (or may define) openings respectively exposing the second light emitting regions LA2 and the third light emitting regions LA3.

Referring to FIGS. 1 2, 3, 4, 5, and 7, the second color filter layer 184 may have the second color (e.g., a green color), and may selectively transmit light having the second color. For example, the second color filter layer 184 may include an organic material such as a photoresist and dye or pigment having the second color.

As illustrated in FIGS. 4, 5, and 7, the second color filter layer 184 may overlap (e.g., overlap in the thickness direction of the base substrate 110) the second light emitting region LA2. For example, the second color filter layer 184 may overlap each of the plurality of second light emitting regions LA2 disposed in a matrix form in the display region. The second color filter layer 184 may not overlap the first light emitting regions LA1 and the third light emitting regions LA3.

In an embodiment, the second color filter layer 184 may overlap (e.g., overlap in the thickness direction of the base substrate 110) a portion of the light blocking region BA. For example, an area (e.g., an area in a plan view) of the portion of the light blocking region BA where the second color filter layer 184 overlaps may be less than an area (e.g., an area in the plan view) of a remaining portion of the light blocking region BA where the second color filter layer 184 does not overlap.

In an embodiment, the second color filter layer 184 may include a plurality of island patterns 184a and a plurality of connection patterns 184b. Each of the island patterns 184a and the connection patterns 184b may not overlap the first light emitting regions LA1 and the third light emitting regions LA3. The island patterns 184a and the connection patterns 184b may be integrally formed. For example the island patterns 184a and the connection patterns 184b may form a single, monolithic structure.

The island patterns 184a may respectively overlap the second light emitting regions LA2. For example, in the display region, the island patterns 184a may be disposed in a matrix form in the first direction D1 and the second direction D2.

In an embodiment, each of the island patterns 184a may have a planar shape substantially the same as or similar to a planar shape of a corresponding second light emitting region LA2. Each of the island patterns 184a may overlap the entirety of the corresponding second light emitting region LA2. For example, an area of each of the island patterns 184a may be equal to or greater than an area of the corresponding second light emitting region LA2.

Each of the connection patterns 184b may connect island patterns 184a adjacent to each other. In an embodiment, each of the connection patterns 184b may have a relatively narrow width. For example, the connection patterns 184b may overlap (e.g., overlap in the thickness direction of the base substrate 110) a portion of the light blocking region BA, and an area (e.g., an area in a plan view) of the portion of the light blocking region BA where the connection patterns 184b overlap may be less than an area (e.g., an area in a plan view) of a remaining portion of the light blocking region BA where the connection patterns 184b do not overlap. In one or more embodiments, the width of each of the connection patterns 184b may be less than a width of the island patterns 184a connected by the corresponding connection pattern 184b.

The connection patterns 184b may include first connection patterns 184b-1 and second connection patterns 184b-2.

Each of the first connection patterns 184b-1 may connect the island patterns 184a adjacent to each other in the first direction D1. Each of the first connection patterns 184b-1 may generally extend in the first direction D1. The width of the first connection patterns 184b-1 may be measured in the second direction D2.

Each of the second connection patterns 184b-2 may connect the island patterns 184a adjacent to each other in the second direction D2. Each of the second connection patterns 184b-2 may generally extend in the second direction D2. The width of the second connection patterns 184b-2 may be measured in the first direction D1.

In an embodiment, as illustrated in FIG. 7, in each of the pixel regions PA, each of the second connection patterns 184b-2 may be disposed between the first light emitting region LA1 and the third light emitting region LA3 (e.g., in a plan view). Each of the second connection patterns 184b-2 may be spaced from each of the first light emitting region LA1 and the third light emitting region LA3. For example, a width of each of the second connection patterns 184b-2 in the first direction D1 may be less than a distance between the first light emitting region LA1 and the third light emitting region LA3 in the first direction D1. In other words, the width of each of the second connection patterns 184b-2 in the first direction D1 may be less than a width of a portion of the light blocking region BA between the first light emitting region LA1 and the third light emitting region LA3 in the first direction D1.

Each of the first connection patterns 184b-1 may have a relatively narrow width in the second direction D2. Each of the second connection patterns 184b-2 may have a relatively narrow width in the first direction D1. In an embodiment, a width of each of the first connection patterns 184b-1 in the second direction D2 may be equal to the width of each of the second connection patterns 184b-2 in the first direction D1. For example, each of the first connection patterns 184b-1 and the second connection patterns 184b-2 may be formed to have a reduced width (e.g., a minimum width) realized by a photolithography process. However, the present disclosure is not limited thereto.

Referring to FIGS. 1, 2, 3, 4, 5, and 8, the third color filter layer 186 may have the third color (e.g., a blue color), and may selectively transmit light having the third color. For example, the third color filter layer 186 may include an organic material such as a photoresist and dye or pigment having the third color.

As illustrated in FIGS. 4, 5, and 8, the third color filter layer 186 may overlap the third light emitting region LA3. For example, the third color filter layer 186 may overlap (e.g., overlap in the thickness direction of the base substrate 110) each of the plurality of third light emitting regions LA3 disposed in a matrix form in the display region. The third color filter layer 186 may not overlap the first light emitting regions LA1 and the second light emitting regions LA2.

In an embodiment, the third color filter layer 186 may further overlap (e.g., overlap in the thickness direction of the base substrate 110) the light blocking region BA. The third color filter layer 186 may overlap the entirety of the light blocking region BA. For example, as illustrated in FIG. 8, the third color filter layer 186 may entirely overlap the third light emitting regions LA3 and the light blocking region BA in a plan view, and may have (or may define) openings respectively exposing the first light emitting regions LA1 and the second light emitting regions LA2.

In an embodiment, as illustrated in FIGS. 2 and 3, the first color filter layer 182 may be disposed on the second color filter layer 184, and the third color filter layer 186 may be disposed on the first color filter layer 182. For example, during a manufacturing process of the display device 10, the second color filter layer 184, the first color filter layer 182, and the third color filter layer 186 may be sequentially formed on a lower layer (e.g., on the second passivation layer 162). Accordingly, in the light blocking region BA, the first color filter layer 182 may cover an upper surface and a side surface of each of the connection patterns 184b of the second color filter layer 184.

In the entirety of the light blocking region BA, the first color filter layer 182 and the third color filter layer 184 may be stacked to overlap in a thickness direction. Accordingly, even if a black matrix is not formed in the light blocking region BA, external light may be effectively blocked in the entirety of the light blocking region BA.

In an embodiment, an upper layer such as an optical film (e.g., an anti-reflection film), a protective window, and/or the like may be formed on the color filter layer 180. If the second color filter layer 184 overlaps the entirety of the light blocking region BA, the first to third color filter layers 182, 184, and 186 may be stacked to overlap in the thickness direction in the entirety of the light blocking region BA. In this case, a step difference between the light blocking region BA and the first to third light emitting regions LA1, LA2, and LA3 may be relatively large, so that the upper layer formed on the color filter layer 180 may be easily separated from the color filter layer 180. In one or more embodiments, if the second color filter layer 184 overlaps the entirety of the light blocking region BA, impurities such as oxygen may penetrate into the display region through the second color filter layer 184 through which the impurities are relatively easy to penetrate. Accordingly, in order to prevent or substantially prevent such problems, the second color filter layer 184 may be formed not to overlap at least a portion of the light blocking region BA.

In one or more embodiments, if the second color filter layer 184 includes only the island patterns 184a and does not include the connection patterns 184b (i.e., the second color filter layer 184 overlaps only in the second light emitting regions LA2). At least some of the island patterns 184a may be easily separated from the lower layer. Accordingly, in order to prevent or substantially prevent this problem, in one or more embodiments, the second color filter layer 184 may include the connection patterns 184b connecting the island patterns 184a adjacent to each other. In one or more embodiments, each of the connection patterns 184b may be formed to have a relatively narrow width (e.g., a minimum width). Accordingly, a portion of the light blocking region BA where the second color filter layer 184 overlaps may be minimized or reduced while preventing or reducing the separation of the second color filter layer 184 from the lower layer by the connection patterns 184b. Accordingly, by minimizing or reducing a region in which a relatively large step is formed by the connection patterns 184b, the separation of the upper layer from the color filter layer 180 may be prevented or reduced. In one or more embodiments, the penetration of the impurities into the display region through the second color filter layer 184 may be prevented or reduced. Accordingly, a reliability of the display device 10 may be improved.

Figure 9:
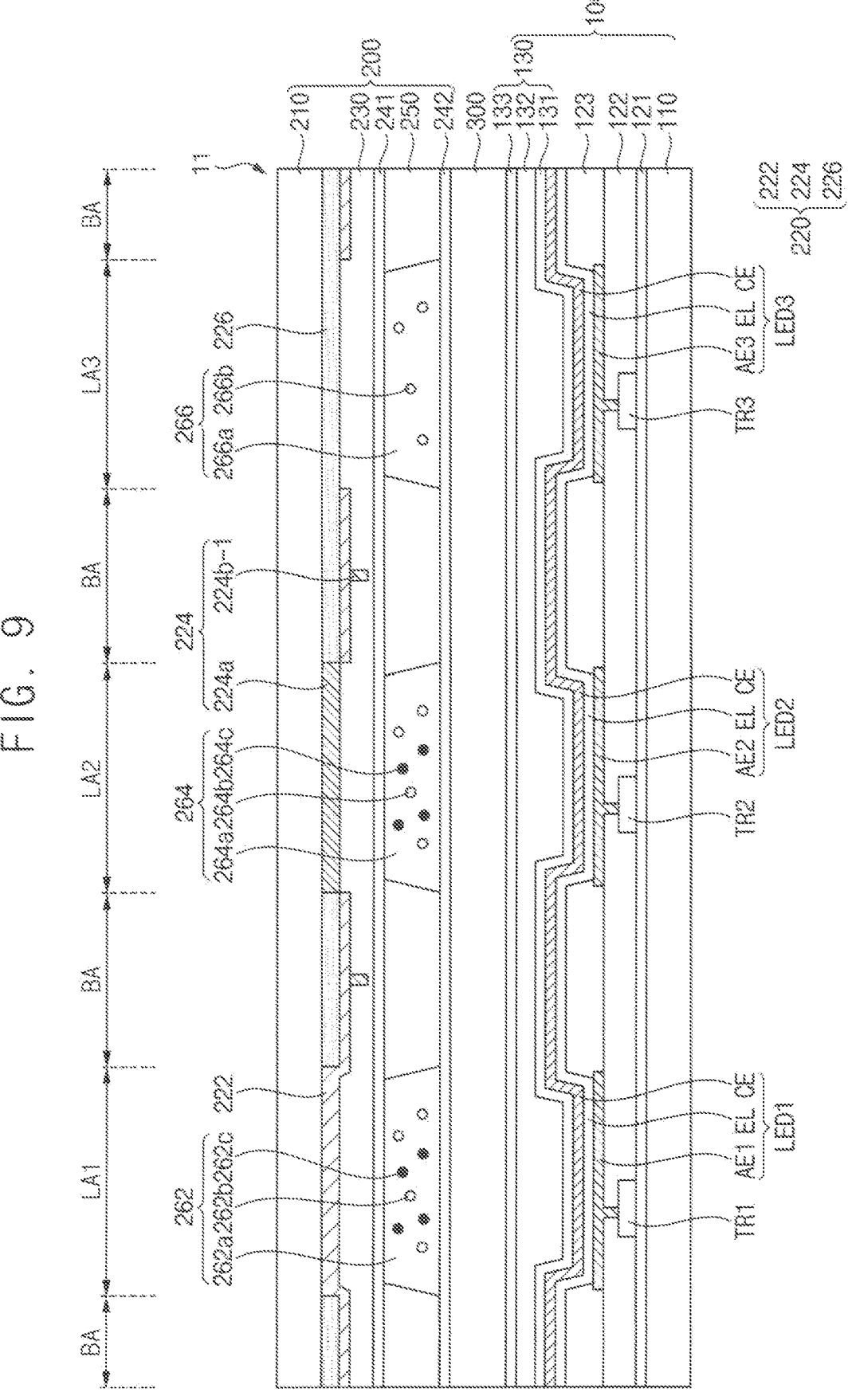
FIG. 9 is a cross-sectional view of a display device according to another embodiment.

FIG. 9 is a cross-sectional view of a display device according to another embodiment.

Hereinafter, a display device 11 according to another embodiment will be described with reference to FIG. 9. The display device 11 of FIG. 9 may be substantially the same as or similar to the display device 10 of FIG. 2 except that the display device 11 includes a first substrate 100 and a second substrate 200 coupled to each other by a sealing member. Accordingly, repeated descriptions may not be provided or may be simplified.

Referring to FIG. 9, in an embodiment, a display device 11 may include a first substrate 100 and second substrate 200. The first substrate 100 and the second substrate 200 may each include a display region and a non-display region positioned around the display region. The non-display region may be positioned outside the display region. For example, the non-display region may be around (or may surround) the display region in a plan view.

The first substrate 100 and the second substrate 200 may be coupled to each other by a sealing member disposed in the non-display region. For example, a filling member 300 may be disposed in the display region between the first substrate 100 and the second substrate 200. The filling member 300 may have light transmittance. For example, in one or more embodiments, the filling member 300 may be formed of a transparent material.

The first substrate 100 may include a first base substrate 110, a buffer layer 121, first to third driving elements TR1, TR2, and TR3, an insulating structure 122, a pixel defining layer 123, first to third light emitting elements LED1, LED2, and LED3, and an encapsulation layer 130. In an embodiment, a lower conductive layer may be disposed between the first base substrate 110 and the buffer layer 121. In an embodiment, each of the first to third light emitting elements LED1, LED2, and LED3 may generate blue light. Blue light generated by the first to third light emitting elements LED1, LED2, and LED3 may be incident into the second substrate 200 by passing through the filling member 300. The first substrate 100 may be referred to as a display substrate.

The second substrate 200 may include a second base substrate 210, a color filter layer 220, a low refractive index layer 230, a first passivation layer 241, a bank 250, a first color conversion part 262, a second color conversion part 264, a transmission part 266, and a second passivation layer 242. The second substrate 200 may be referred to as a color conversion substrate.

The second base substrate 210 may be an insulating substrate formed of a transparent material. For example, the second base substrate 210 may include glass, plastic, and/or the like.

The color filter layer 220 may be formed under the second base substrate 210. The color filter layer 220 may include first to third color filter layers 222, 224, and 226. The first to third color filter layers 222, 224, and 226 may have different colors from each other, and may selectively transmit light of different colors from each other. The color filter layer 220 may be substantially the same as or similar to the color filter layer 180 described with reference to FIGS. 4 to 8.

The first color filter layer 222 may have the first color (e.g., a red color), and may selectively transmit light having the first color. The first color filter layer 222 may overlap (e.g., overlap in the thickness direction of the base substrate 110) the first light emitting region LA1, and may not overlap the second light emitting regions LA2 and the third light emitting regions LA3.

In an embodiment, the first color filter layer 222 may further overlap (e.g., overlap in the thickness direction of the base substrate 110) the light blocking region BA. The first color filter layer 222 may overlap an entirety of the light blocking region BA. For example, the first color filter layer 222 may entirely overlap the first light emitting regions LA1 and the light blocking region BA in a plan view, and may have (or may define) openings respectively exposing the second light emitting regions LA2 and the third light emitting regions LA3.

The second color filter layer 224 may have the second color (e.g., a green color), and may selectively transmit light having the second color. The second color filter layer 224 may overlap the second light emitting region LA2, and may not overlap the first light emitting regions LA1 and the third light emitting regions LA3.

In an embodiment, the second color filter layer 224 may overlap (e.g., overlap in the thickness direction of the base substrate 110) a portion of the light blocking region BA. For example, an area (e.g., an area in a plan view) of the portion of the light blocking region BA where the second color filter layer 224 overlaps may be less than an area (e.g., an area in a plan view) of a remaining portion of the light blocking region BA where the second color filter layer 224 does not overlap.

In an embodiment, the second color filter layer 224 may include a plurality of island patterns 224a and a plurality of connection patterns 224b-1. In the display region, the island patterns 224a may be disposed in a matrix form in the first direction D1 and the second direction D2. Each of the connection patterns 224b-1 may connect the island patterns 224a adjacent to each other. Each of the connection patterns 224b-1 may be formed to have a reduced width (e.g., a minimum width) realized by a photolithography process. However, the present disclosure is not limited thereto.

The third color filter layer 226 may have the third color (e.g., a blue color), and may selectively transmit light having the third color. The third color filter layer 226 may overlap the third light emitting region LA3, and may not overlap the first light emitting regions LA1 and the second light emitting regions LA2.

In an embodiment, the third color filter layer 226 may further overlap (e.g., overlap in the thickness direction of the base substrate 110) the light blocking region BA. The third color filter layer 226 may overlap the entirety of the light blocking region BA. For example, the third color filter layer 226 may entirely overlap the third light emitting regions LA3 and the light blocking region BA in a plan view, and may have (or may define) openings respectively exposing the first light emitting regions LA1 and the second light emitting regions LA2.

In an embodiment, as illustrated in FIG. 9, the first color filter layer 222 may be disposed on the second color filter layer 224, and the third color filter layer 226 may be disposed on the first color filter layer 222. For example, during a manufacturing process of the display device 11, the third color filter layer 226, the first color filter layer 222, and the second color filter layer 224 may be sequentially formed on the second base substrate 210. Subsequently, after the second substrate 200 is manufactured by forming the low refractive index layer 230, the first passivation layer 241, the bank 250, the first color conversion part 262, the second color conversion part 264, the transmission part 266, and the second passivation layer 242, the second substrate 200 may be coupled to the first substrate 100. Accordingly, as illustrated in FIG. 9, in the light blocking region BA, the first color filter layer 222 may cover an upper surface and a side surface of each of the connection patterns 224b-1 of the second color filter layer 224.

The low refractive index layer 230 may be disposed under the color filter layer 220. The low refractive index layer 230 may cover the side surface and a lower surface of each of the connection patterns 224b-1 of the second color filter layer 224. A refractive index of the low refractive index layer 230 may be less than each of a refractive index of the first color conversion part 262, a refractive index of the second color conversion part 264, and a refractive index of the transmission part 266. The low refractive index layer 230 may improve light extraction efficiency to increase luminance and lifespan of the display device 11.

In an embodiment, the low refractive index layer 230 may be disposed on the first color conversion part 262, the second color conversion part 264, and the transmission part 266. In another embodiment, the low refractive index layer 230 may be disposed under the first color conversion part 262, the second color conversion part 264, and the transmission part 266. In still another embodiment, a plurality of low refractive index layers 230 may be provided, and the low refractive index layers 230 may be respectively disposed on and under the first color conversion part 262, the second color conversion part 264, and the transmission part 266. For example, the first color conversion part 262, the second color conversion part 264, and the transmission part 266 may be between a first one of the plurality of low refractive index layers 230 and a second one of the plurality of low refractive index layers 230.

The first passivation layer 241 may be disposed under the low refractive index layer 230. The first passivation layer 241 may cover a lower surface of the low refractive index layer 230. The first passivation layer 241 may include an inorganic insulating material.

The bank 250 may be disposed in the display region under the first passivation layer 241. A plurality of openings may be formed in the bank 250. For example, as illustrated in FIG. 9, the openings of the bank 250 may respectively expose the first to third light emitting regions LA1, LA2, and LA3. The bank 250 may form a space to receive an ink composition for forming the first color conversion part 262, the second color conversion part 264, and the transmission part 266. For example, the bank 250 may entirely overlap the light blocking region BA, and may have a grid shape in a plan view.

The first color conversion part 262, the second color conversion part 264, and the transmission part 266 may disposed in the display region under the first passivation layer 241, and may respectively overlap the first to third light emitting regions LA1, LA2 and LA3. For example, the first color conversion part 262, the second color conversion part 264, and the transmission part 266 may be respectively disposed in the openings of the bank 250.

The second passivation layer 242 may be disposed under the bank 250, the first color conversion part 262, the second color conversion part 264, and the transmission part 266. The second passivation layer 242 may cover lower surfaces of the bank 250, the first color conversion part 262, the second color conversion part 264, and the transmission part 266. The second passivation layer 242 may include an inorganic insulating material.

In one or more embodiments, the second color filter layer 224 may include the connection patterns 224*b*-1 connecting the island patterns 224*a* adjacent to each other. In one or more embodiments, each of the connection patterns 224*b*-1 may be formed to have a relatively narrow width (e.g., a minimum width). Accordingly, separation of the second color filter layer from the second base substrate 210 may be prevented or reduced by the connection patterns 224*b*-1, and penetration of impurities such as moisture into the display region through the second color filter layer 224 may be prevented or reduced. Accordingly, a reliability of the display device 11 may be improved.

Figure 10:
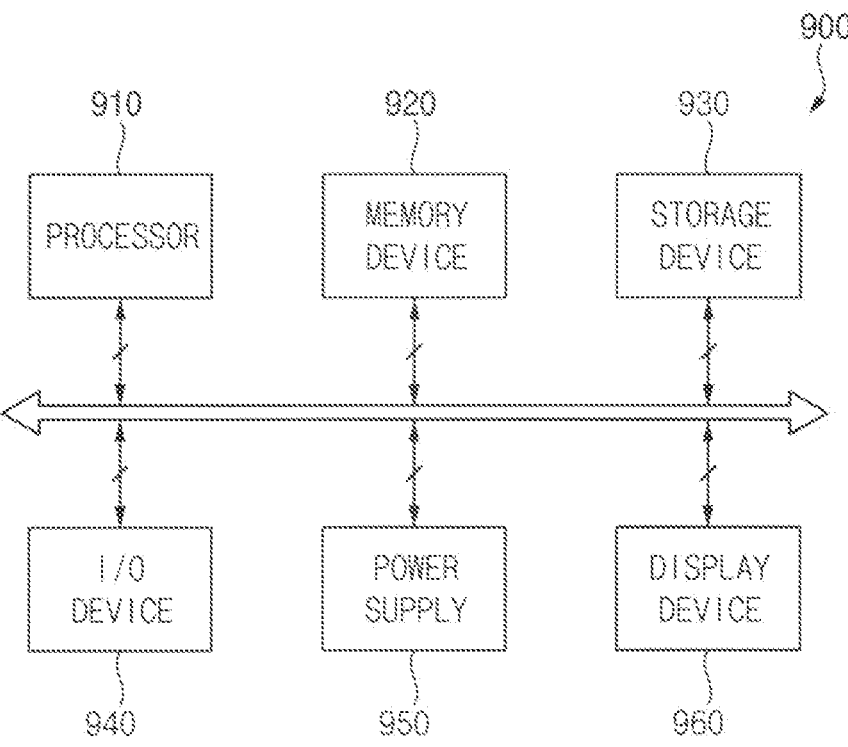
FIG. 10 is a block diagram illustrating an electronic device according to an embodiment.

FIG. 10 is a block diagram illustrating an electronic device according to an embodiment.

Referring to FIG. 10, in an embodiment, an electronic device 900 may include a processor 910, a memory device 920, a storage device 930, an input/output ("I/O") device 940, a power supply 950, and a display device 960. Here, the display device 960 may correspond to the display device 10 of FIG. 2 or the display device 11 of FIG. 9. The electronic device 900 may further include a plurality of ports for communicating with a video card, a sound card, a memory card, a universal serial bus ("USB") device, and/or the like. In an embodiment, the electronic device 900 may be implemented as a television. In another embodiment, the electronic device 900 may be implemented as a smart phone. However, the present disclosure is not limited thereto, in another embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), and/or the like.

The processor 910 may perform one or more suitable computing functions. In an embodiment, the processor 910 may be a microprocessor, a central processing unit ("CPU"), an application processor ("AP"), and/or the like. The processor 910 may be coupled to other components via an address bus, a control bus, a data bus, and/or the like. In an embodiment, the processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and/or the like, and/or at least one volatile memory device such as a dynamic random access memory ("DRAM") device, a static random access memory ("SRAM") device, a mobile DRAM device, and/or the like.

In an embodiment, the storage device 930 may include a solid state drive ("SSD") device, a hard disk drive ("HDD") device, a CD-ROM device, and/or the like. In an embodiment, the I/O device 940 may include an input device such as a keyboard, a keypad, a mouse device, a touchpad, a touch-screen, and/or the like, and an output device such as a printer, a speaker, and/or the like.

The power supply 950 may provide power for operations of the electronic device 900. The display device 960 may be coupled to other components via the buses or other communication links. In an embodiment, the display device 960 may be included in the I/O device 940.

Although certain embodiments and implementations have been described herein, other embodiments and modifications will be apparent from this description. Accordingly, the present disclosure are not limited to such embodiments, but rather to the broader scope of the appended claims and various suitable modifications and equivalent arrangements as would be apparent to a person of ordinary skill in the art.

What is claimed is:

1. A display device comprising:
   a base substrate comprising a plurality of pixel regions and a light-blocking region, a pixel region from among the plurality of pixel regions comprising a first light-emitting region, a second light-emitting region, and a third light-emitting region for emitting light of different colors from each other, the light-blocking region surrounding the first light-emitting region to the third light-emitting region;
   a first color filter layer on the base substrate, having a red color, and overlapping the first light-emitting region and an entirety of the light-blocking region;
   a second color filter layer on the base substrate, having a green color, and overlapping the second light-emitting region and a portion of the light-blocking region; and
   a third color filter layer on the base substrate, having a blue color, and overlapping the third light-emitting region and an entirety of the light-blocking region.

2. The display device of claim 1, wherein an area of the portion of the light-blocking region overlapping the second color filter layer is less than an area of a remaining portion of the light-blocking region.

3. The display device of claim 1, wherein the second color filter layer comprises:
   island patterns overlapping the second light-emitting region; and
   connection patterns connecting the island patterns adjacent to each other, the connection patterns overlapping the portion of the light-blocking region.

4. The display device of claim 3, wherein the connection patterns are spaced from each of the first light-emitting region and the third light-emitting region.

5. The display device of claim 3, wherein the island patterns are in a matrix form along a first direction and a second direction crossing the first direction, and
   wherein the connection patterns comprise:
   a first connection pattern connecting the island patterns adjacent to each other in the first direction, the first connection pattern extending in the first direction; and
   a second connection pattern connecting the island patterns adjacent to each other in the second direction, the second connection pattern extending in the second direction.

6. The display device of claim 5, wherein a width of the first connection pattern in the second direction is equal to a width of the second connection pattern in the first direction.

7. The display device of claim 5, wherein in the pixel region, the third light-emitting region is spaced from the first light-emitting region in the first direction, the second light-emitting region is spaced from the first light-emitting region and the third light-emitting region in the second direction, and the second connection pattern is between the first light-emitting region and the third light-emitting region.

8. The display device of claim 7, wherein a width of the second connection pattern in the first direction is less than a distance between the first light-emitting region and the third light-emitting region in the first direction.

9. The display device of claim 3, wherein the island patterns and the connection patterns are integrally formed.

10. The display device of claim 3, wherein the first color filter layer defines openings exposing the second light-emitting region and the third light-emitting region, and wherein the third color filter layer defines openings exposing the first light-emitting region and the second light-emitting region.

11. The display device of claim 3, wherein in the light-blocking region, the first color filter layer is on the connection patterns, and the third color filter layer is on the first color filter layer.

12. The display device of claim 11, wherein in the light-blocking region, the first color filter layer covers a side surface of the connection patterns.

13. The display device of claim 11, wherein in the light-blocking region, the first color filter layer exposes a side surface of the connection patterns.

14. A display device comprising:

a base substrate comprising a plurality of pixel regions and a light-blocking region, a pixel region from among the plurality of pixel regions comprising first light-emitting regions, second light-emitting regions, and third light-emitting regions emitting light of different colors from each other, the light-blocking region surrounding the first to third light-emitting regions;

a first color filter layer on the base substrate, having a first color, and defining openings exposing the second light-emitting regions and the third light-emitting regions;

a second color filter layer on the base substrate, having a second color, and comprising island patterns and connection patterns, the island patterns overlapping the second light-emitting regions, the connection patterns connecting ones of the island patterns adjacent to each other in a first direction in a plan view and connecting others of the island pattern adjacent to each other in a second direction in the plan view, the first direction crossing the second direction in the plan view, and overlapping a portion of the light-blocking region; and a third color filter layer on the base substrate, having a third color, and defining openings exposing the first light-emitting regions and the second light-emitting regions.

15. The display device of claim 14, wherein the first color is red, the second color is green, and the third color is blue.

16. The display device of claim 14, wherein an area of the portion of the light-blocking region overlapping the connection patterns is less than an area of a remaining portion of the light-blocking region.

17. The display device of claim 14, wherein the connection patterns are spaced from each of the first light-emitting regions and the third light-emitting regions.

18. The display device of claim 14, wherein the island patterns and the connection patterns are integrally formed.

19. An electronic device comprising:

a display device including:

a base substrate comprising a plurality of pixel regions and a light-blocking region, a pixel region from among the plurality of pixel regions comprising a first light-emitting region, a second light-emitting region, and a third light-emitting region emitting light of different colors from each other, the light-blocking region surrounding the first light-emitting region to the third light-emitting region;

a first color filter layer on the base substrate, having a red color, and overlapping the first light-emitting region and an entirety of the light-blocking region;

a second color filter layer on the base substrate, having a green color, and overlapping the second light-emitting region and a portion of the light-blocking region; and a third color filter layer on the base substrate, having a blue color, and overlapping the third light-emitting region and an entirety of the light-blocking region; and a processor which controls an operation of the display device.

* * * * *